(12) United States Patent
Liu et al.

(10) Patent No.: US 8,643,151 B2
(45) Date of Patent: Feb. 4, 2014

(54) PASSIVATION LAYER FOR SEMICONDUCTOR DEVICES

(75) Inventors: Jen-Hao Liu, Zhunan Township (TW);
Chyi-Tsong Ni, Hsinchu (TW);
Hsiao-Yin Lin, Hsinchu (TW);
Chung-Min Lin, Taipei (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 338 days.

(21) Appl. No.: 13/036,897

(22) Filed: Feb. 28, 2011

(65) Prior Publication Data

US 2012/0217633 A1 Aug. 30, 2012

(51) Int. Cl.
*H01L 23/58* (2006.01)
(52) U.S. Cl.
USPC ........... 257/635; 257/750; 257/758; 257/760; 257/E23.126; 257/E23.134; 438/763; 438/778
(58) Field of Classification Search
USPC .................. 257/635, 750, 758, 760, E23.116, 257/E23.126, E23.134, E23.194; 438/763, 438/778

See application file for complete search history.

(56) References Cited

U.S. PATENT DOCUMENTS

| 5,554,418 | A | 9/1996 | Ito et al. |
| 6,017,780 | A | 1/2000 | Roy |
| 6,087,278 | A | 7/2000 | Kim et al. |
| 6,228,780 | B1 | 5/2001 | Kuo et al. |
| 6,521,922 | B1 | 2/2003 | Huang et al. |
| 2012/0217641 | A1* | 8/2012 | Chen et al. ................. 257/771 |

* cited by examiner

*Primary Examiner* — Matthew E Warren
(74) *Attorney, Agent, or Firm* — Lowe Hauptman & Ham, LLP

(57) ABSTRACT

An embodiment of the disclosure provides a semiconductor device. The semiconductor device includes a plurality of metallization layers comprising a topmost metallization layer. The topmost metallization layer has two metal features having a thickness T1 and being separated by a gap. A composite passivation layer comprises a HDP CVD oxide layer under a nitride layer. The composite passivation layer is disposed over the metal features and partially fills the gap. The composite passivation layer has a thickness T2 about 20% to 50% of the thickness T1.

20 Claims, 6 Drawing Sheets

PASSIVATION LAYER FOR SEMICONDUCTOR DEVICES

TECHNICAL FIELD

The disclosure relates generally to the semiconductor devices, and more particularly, to structures and methods of forming a passivation layer for semiconductor devices.

BACKGROUND

In a typical integrated circuit (IC) formation process, a passivation layer or passivation layers are formed to protect the internal semiconductor devices after the completion of metallization. The passivation layers are typically formed with deposition of an oxide layer and a nitride layer. In some examples, the oxide layer and the nitride layer are formed by performing plasma enhanced chemical vapor deposition (PECVD).

However, the conventional passivation layers have a number of shortcomings. With the trend of high integration of semiconductor devices, the distance between the metallization layers decreases. The PECVD oxide layer and the PECVD nitride layer can not sufficiently fill in the gap between the metallization layers due to their characteristic of step coverage, thereby voids would be formed. The voids would weaken mechanical protection for the underlying semiconductor devices. Some contamination or moisture can penetrate through the semiconductor devices. Also, the electrical performances of the semiconductor devices would be negatively affected. Therefore, the failure rate of the overall assembly could increase.

Accordingly, there is a need for an improved structure and method for fabricating the passivation layer.

BRIEF DESCRIPTION OF THE DRAWINGS

Exemplary embodiments will be described with reference to the accompanying figures. It should be understood that the drawings are for illustrative purposes and are therefore not drawn to scale.

DETAILED DESCRIPTION

It is to be understood that the following disclosure provides many different embodiments, or examples, for implementing different features of the application. Specific examples of components and arrangements are described below to simplify the present disclosure. These are, of course, merely examples and are not intended to be limiting. Moreover, the formation of a first feature over, above, or on a second feature in the description that follows may include embodiments in which the first and second features are formed in direct contact, and may also include embodiments in which additional features are formed interposing the first and second features, such that the first and second features may not be in direct contact. Various features may be arbitrarily drawn in different scales for simplicity and clarity.

This disclosure includes a plurality of dies fabricated on a semiconductor wafer. The dies on the semiconductor wafer are divided by scribe lines between the dies. The term "wafer" herein generally refers to the semiconductor substrate on which various layers and device structures are formed. In some embodiments, the semiconductor substrate includes silicon or compound semiconductor, such as GaAs, InP, Si/Ge, or SiC. Examples of such layers include dielectric layers, doped layers, and/or polysilicon layers. Examples of device structures include transistors, resistors, and/or capacitors, which may or may not be interconnected through an interconnect layer to additional active circuits.

It is noted that some processes may only be briefly described herein for the sake of simplicity and clarity. Accordingly, it is understood that additional processes may be provided before, during, and after the method 100 of FIG. 1.

Figure 1:
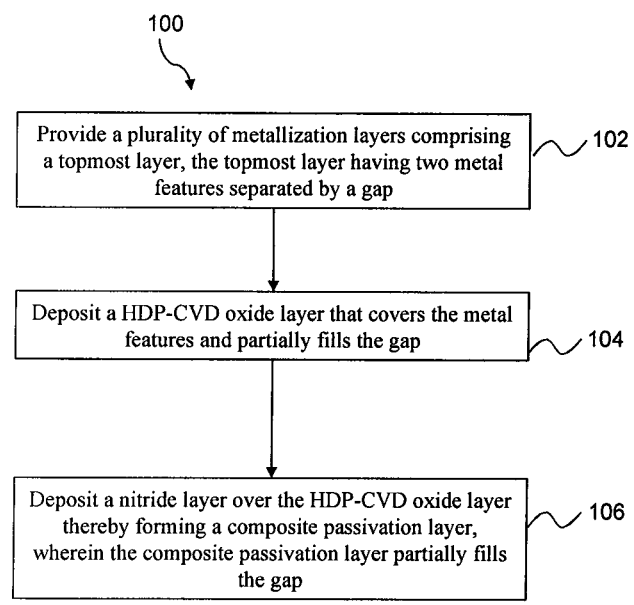
FIG. 1 is a flowchart of a method of fabricating a semiconductor device with a passivation layer according to some embodiments of the disclosure.

Referring now to FIG. 1, method 100 for fabricating a semiconductor device with a passivation layer begins with block 102. At block 102, a plurality of metallization layers including a topmost metallization layer is provided. The topmost metallization layer has two metal features separated by a gap. Each of the metal features has a thickness T1. The method 100 continues with block 104 in which an oxide layer is deposited by performing a high density plasma (HDP) chemical vapor deposition (CVD). The oxide layer covers the metal features and partially fills the gap. In at least one embodiment, the oxide layer deposits directly on the metal features and the gap. The method 100 continues with block 106 in which a nitride layer is deposited over the HDP CVD oxide layer thereby forming a composite passivation layer. The composite passivation layer comprises the HDP CVD oxide layer and the nitride layer. The composite passivation layer partially fills the gap and has a thickness T2. The thickness T2 is about 20% to 50% of the thickness T1. In at least one embodiment, the nitride layer deposits conformally over the HDP CVD oxide layer. In another embodiment, a plasma enhanced oxide layer is further deposited between the deposition of the HDP CVD oxide layer and the deposition of the nitride layer. In one embodiment, the method 100 further includes forming an under bump metallurgy (UBM) layer over the composite passivation layer. The UBM layer extends through the composite passivation layer and contacts a portion of at least one of the metal features. A conductive pillar is formed over the UBM layer. Other layers, lines, vias and structures may also be provided before, during, or after the steps of method 100.

FIG. 2 to FIG. 6 are cross-sectional views showing various stages during fabrication of a semiconductor device 200 with a passivation layer according to one or more embodiments according to FIG. 1.

Figure 2:
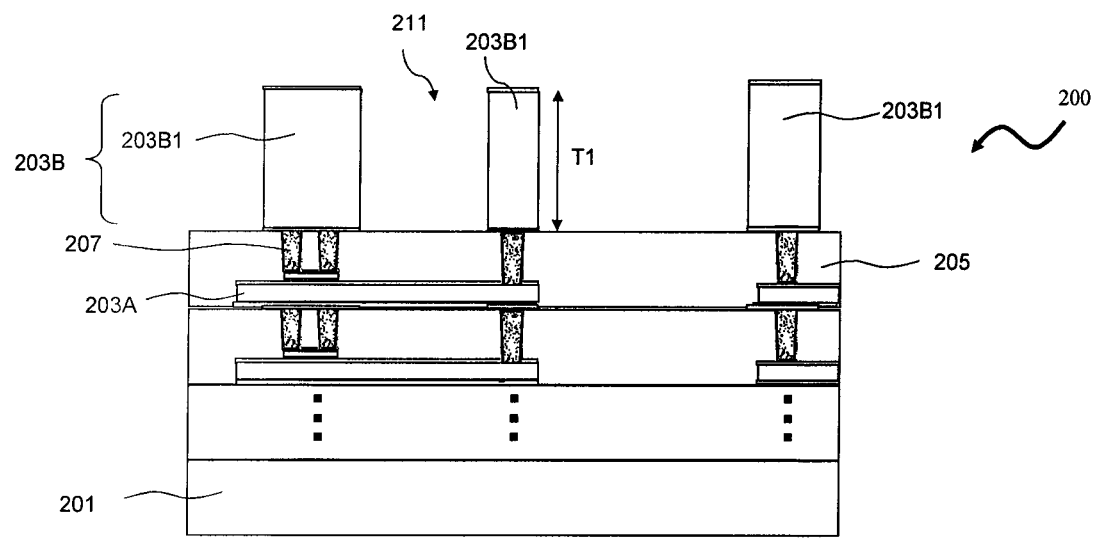
FIG. 2 to FIG. 6 are cross-sectional views showing various stages during fabrication of a semiconductor device with a passivation layer according to one or more embodiments according to FIG. 1.

Referring now to FIG. 2, the semiconductor device 200 may include a semiconductor substrate 201 is provided. The semiconductor substrate 201 may include silicon or compound semiconductor, such as GaAs, InP, Si/Ge, or SiC. The substrate 201 may further include doped regions, such as a P-well, an N-well, and/or a doped active region such as a P+ doped active region.

The device 200 may further include isolation structure, such as shallow trench isolation (STI) features or Local Oxidation of Silicon (LOCOS) features formed in the substrate 201 for isolating active regions from other regions in the substrate 201. The active regions may be configured as an N-type metal-oxide semiconductor (NMOS) device or as a P-type metal-oxide semiconductor (PMOS) device in one example.

The device 200 may further include device structures such as transistors, resistors, and/or capacitors (not shown) overlying the substrate 201.

Next, a plurality of dielectric layers 205 is formed over the substrate 201. A plurality of metallization layers 203A/203B and conductive vias 207 are disposed within the dielectric layers 205. The metallization layers 203A/203B and vias 207 electrically connect integrated circuit components, and provide electrical connections from the underlying integrated circuit components to the upper layers. The metallization layers 203A/203B includes a topmost metallization layer 203B. The topmost metallization layer 203B has two metal features 203B1 separated by a gap 211 having an aspect ratio of about 1.5 to 2. Each metal feature 203B1 has a thickness T1 of about 3 micrometers ($\mu$m) to 6 $\mu$m. In at least one embodiment, the metal features 203B1 include a line, a bar, a pillar, and/or a block.

In one example, the dielectric layers 205 are formed by deposition techniques, such as chemical vapor deposition (CVD) and/or a high density plasma (HDP) CVD process. In some embodiments, the dielectric layers 205 are formed of low dielectric constant (low-k) dielectric materials with dielectric constants (k value) between about 2.9 and 3.8, ultra low-k (ULK) dielectric materials with k values between about 2.5 and about 2.9, or some combination of low-k dielectric materials.

Metallization layers 203A/203B may include an electrically conductive material such as aluminum, aluminum alloy, copper, copper alloy, or combinations thereof. The metallization layers 203A/203B are deposited, in some embodiments, by physical vapor deposition (PVD) such as a sputtering deposition using a sputtering target made of aluminum, copper or an alloy thereof, followed by patterning the metallization layers 203A/203B with photolithography and etching. In at least one embodiment, the metal features 203B1 comprise aluminum.

Figure 3:
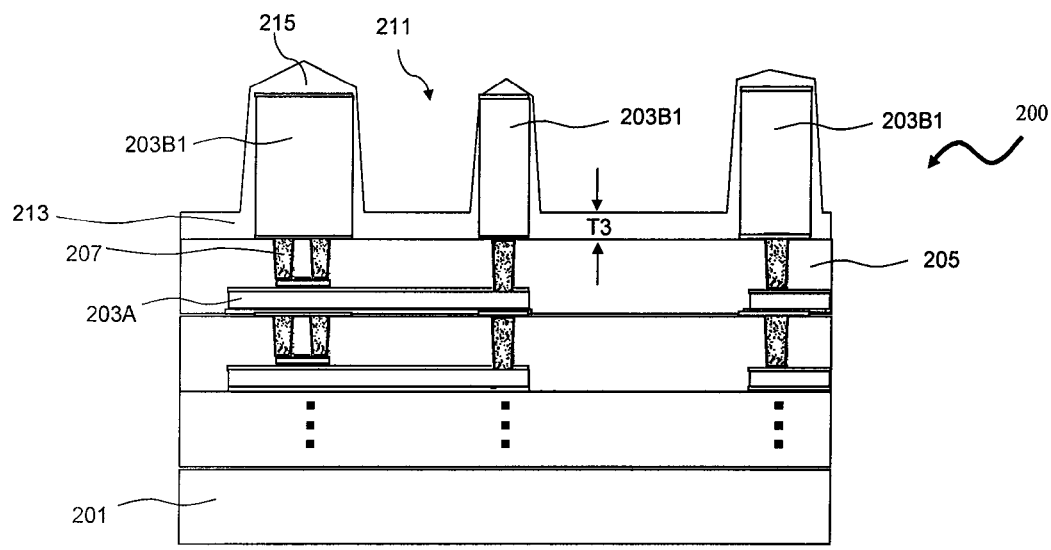

Referring to FIG. 3, an oxide layer 213 is deposited by performing high density plasma (HDP) chemical vapor deposition (CVD). The HDP CVD oxide layer 213 covers the metal features 203B1 and partially fills the gap 211. The HDP CVD oxide layer 213 has a thickness T3 of over 0.2 $\mu$m. The HDP CVD is a type of plasma-enhanced CVD performed under high vacuum and at high plasma excitation voltage in order to improve the ability to fill small high aspect ratio structures. The HDP CVD is performed by alternating deposition mode and sputtering mode during the formation of the oxide layer. Because of the characteristics of the HDP CVD oxide deposition, the oxide layer 213 overlying the metal features 203B1 is thicker toward the middle of the metal features 203B1, and thinner toward the edge of the metal features 203B1 and over the gap 211 between the metal features 203B1. As such, the oxide layer 213 is formed to fill a bottom portion of the gap 211 and an inclined roof structure 215 over each of the metal features 203B1. In contrast, in a conventional method using PECVD, the oxide layer tends to overhang at the edge of the metal features and the chance to seal the gap prematurely with a void formed under the overhang is higher. Hence, the bottom sidewalls of the metal features are not properly protected. In this embodiment, the inclined roof structure 215 of the HDP CVD oxide layer 213 with partially-filled gap 211 eliminates the drawbacks in conventional method. The HDP CVD oxide layer 213 well covers the bottom sidewalls of the metal features 203B1 to prevent contamination or moisture. By partially filling the gap 211 with HDP CVD oxide layer 213, the void problem resulted from overhung oxide layer is eliminated. Without fully filling the gap 211 with a thick oxide layer, the embodiments of the present application also have improved efficiency with regard to the process time and reduced manufacturing cost.

In at least one embodiment, a layer of tetraethoxysilane (TEOS) oxide may be deposited over the HDP CVD oxide layer 213 by plasma enhanced chemical vapor deposition (PECVD). PECVD uses a radio frequency (RF) power to generate glow discharge to transfer the energy into the reactant gases, allowing the deposition on the substrate at a lower temperature. PECVD has made the desirable properties such as good adhesion, low pinhole density, good step coverage and adequate electrical properties on the deposited film.

Figure 4:
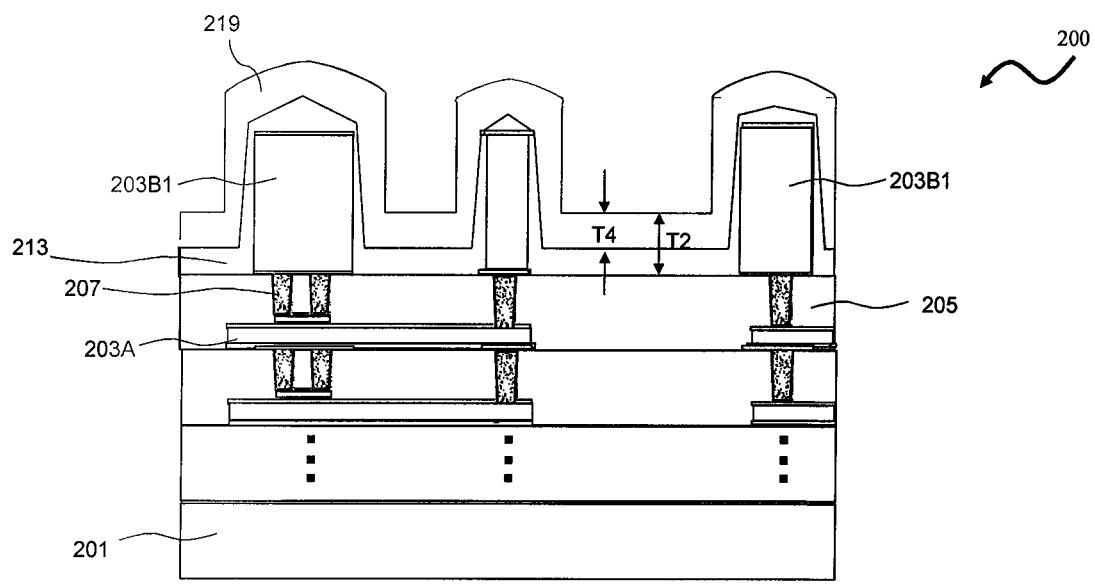

Referring to FIG. 4, a nitride layer 219 is conformally deposited over the HDP CVD oxide layer 213. The nitride layer 219 is deposited by PECVD. The nitride layer 219 may include silicon nitride (SiN) or silicon oxynitride (SiON). The nitride layer 219 prevents or decreases moisture, mechanical, and radiation damage to the integrated circuits. In at least one embodiment, the thickness T3 of the HDP CVD oxide layer 213 is substantially larger than a thickness T4 of the nitride layer 219.

The HDP CVD oxide layer 213 and the nitride layer 219 forms a composite passivation layer. The composite passivation layer partially fills the gap 211 and has a thickness T2 about 20% to 50% of the thickness T1. Without fully filling the gap 211 with a thick passivation layer, the embodiments of this present application have improved efficiency with regard to the process time, reduced manufacturing cost, and a robust protection to underlying integrated circuits with a relatively thinner passivation layer.

Next, photolithography and etching are performed to selectively pattern an opening through the composite passivation layer to expose at least a top surface of one of the metal features 203B1.

Figure 5:
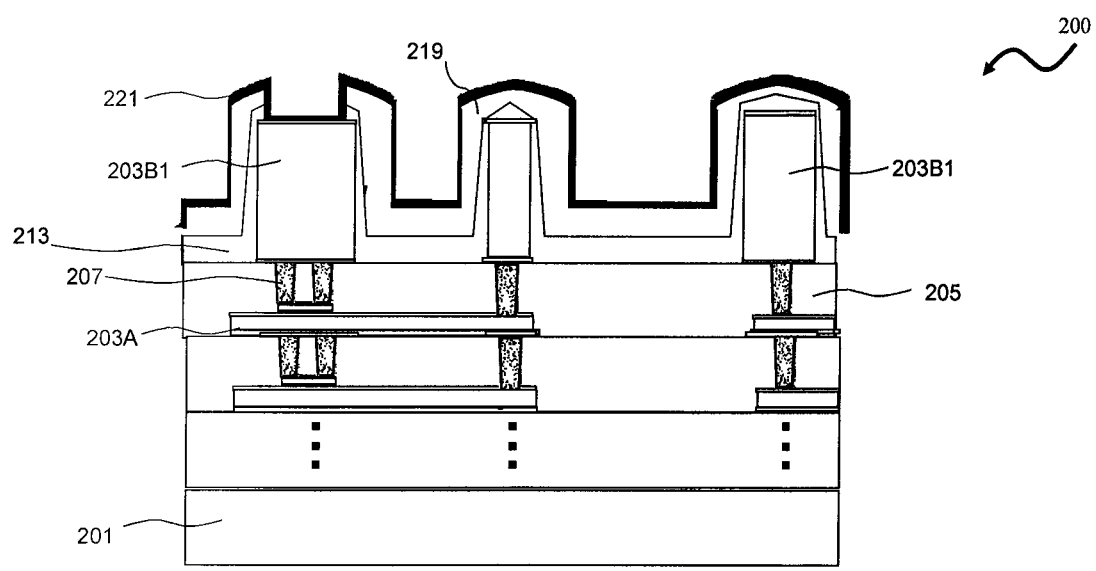

Referring to FIG. 5, an under bump metallurgy (UBM) layer 221 is formed over the nitride layer 219 and lines the sidewalls of the opening and contacts the exposed portion of the metal feature 203B1. The UBM layer 221, in some embodiments, includes multiple layers of conductive materials, such as a layer of titanium, a layer of copper, and/or a layer of nickel. In some embodiments, each layer in the UBM layer 221 is preferably formed using a plating process, such as electrochemical plating, although other processes of formation, such as sputtering, evaporation or electroless plating process, may alternatively be used depending upon the materials to be used. In conventional method, the oxide layer tends to overhang at the edge of the metal features 203B1 and the gap 211 is not well sealed by the oxide layer. A seam above the gap 211 is formed in the oxide layer. Next, the UBM layer is formed in the seam of the oxide layer. The thickness of the UBM layer in the seam is thinner than other portions. The non-uniform thickness of the UBM layer could lead to poor adhesion and poor quality of the UBM layer for the following bump formation process. Advantageously, the composite passivation layer of this embodiment partially fills the gap 211 and leaves enough spacing in the gap 211. The UBM layer 221 could form conformally on the top surface of the composite passivation layer and within the gap 211. The drawbacks of forming the UBM layer in the seam of the oxide layer could be eliminated.

Figure 6:
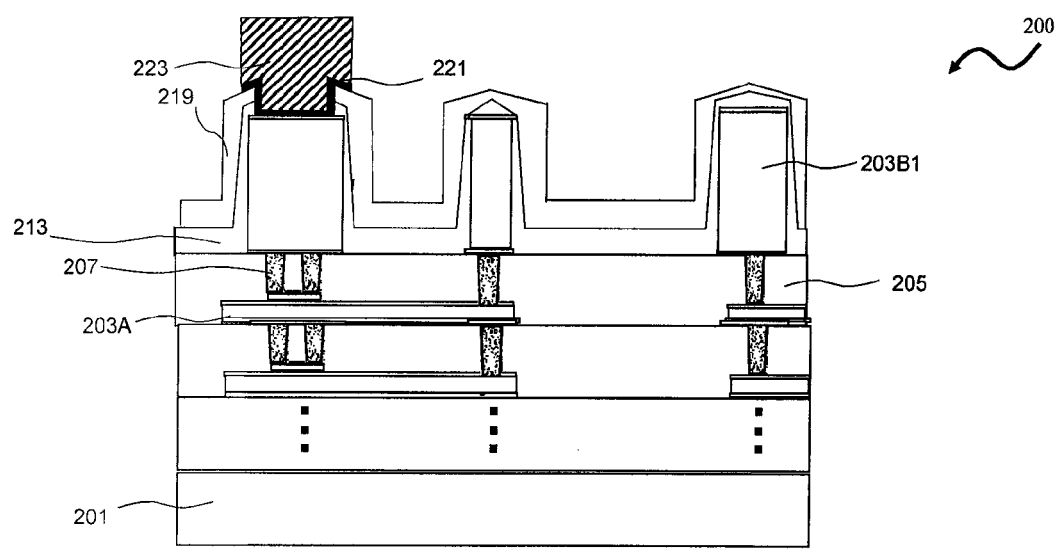

Next, a photoresist layer (not shown) is formed over the UBM layer 221 and developed to form a hole that exposes the UBM layer 221 in the opening and over the exposed portion of the metal feature 203B1. The photoresist layer acts as a mold for metal deposition process for conductive pillar formation. A conductive material is deposited, in some embodiments, in the hole by evaporation, electroplating, or screen printing to form a conductive pillar 223 over the UBM layer 221 as shown in FIG. 6. The conductive material includes any of a variety of metals or metal alloys, such as solder or copper.

After the removal of the photoresist layer, the UBM layer 221 not covered by the conductive pillar 223 is removed by an etching process that etches the exposed portions of the UBM layer 221 down to the underlying nitride layer 219. The remaining UBM layer 221 under the conductive pillar 223 is disposed over the sidewalls of the opening, over a portion of the nitride layer 219, and contacts the exposed portion of the metal feature 203B1. In at least one embodiment, the conductive pillar 223 is a copper pillar. In another embodiment, the conductive pillar 223 is a solder, wherein the solder is reflown by heating to form a solder bump.

Various embodiments of the present invention may be used to moderate the shortcomings of the conventional passivaton layer structure. For example, in the various embodiments the inclined roof structure 215 of the HDP CVD oxide layer 213 that partially fills the gap 211 eliminates the drawbacks in conventional method using PECVD. The HDP CVD oxide layer 213 well covers the bottom sidewalls of the metal features 203B1 to prevent contamination or moisture. By partially filling the gap 211 with HDP CVD oxide layer 213, the void problem resulted from overhang oxide layer is eliminated. Without fully filling the gap 211 with a thick passivation layer, the efficiency of the process time is improved, the cost is reduced, and a robust protection to underlying integrated circuits with a relative thinner composite passivation layer is achieved.

Although exemplary embodiments and the respective advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods, or steps described in the specification. As one of ordinary skill in the art will readily appreciate from the disclosure of the present application, processes, machines, manufacture, compositions of matter, means, methods, or steps, presently existing or later to be developed, that perform substantially the same function or achieve substantially the same result as the corresponding embodiments described herein may be utilized according to the present application. Accordingly, the appended claims are intended to include within their scope such processes, machines, manufacture, compositions of matter, means, methods, or steps.

What is claimed is:

1. A semiconductor device, comprising:
    a plurality of metallization layers comprising a topmost metallization layer, the topmost metallization layer having two metal features separated by a gap, each metal feature having a thickness T1; and
    a composite passivation layer comprising a high density plasma (HDP) chemical vapor deposition (CVD) oxide layer under a nitride layer, the composite passivation layer disposed over the metal features and partially filling the gap, wherein the composite passivation layer has a thickness T2 about 20% to 50% of the thickness T1;
    wherein the HDP CVD oxide layer forms an inclined roof structure over at least one of the metal features.

2. The semiconductor device of claim 1, wherein the HDP CVD oxide layer is directly disposed on the metal features and the gap.

3. The semiconductor device of claim 1, wherein the nitride layer is conformally disposed over the HDP CVD oxide layer.

4. The semiconductor device of claim 1, further comprising a plasma-enhanced oxide layer (PEOX) disposed over the HDP CVD oxide layer and under the nitride layer.

5. The semiconductor device of claim 1, wherein the metal features comprise aluminum.

6. The semiconductor device of claim 1, wherein an aspect ratio of the gap is about 1.5 to 2.

7. The semiconductor device of claim 1, further comprising an under bump metallurgy (UBM) layer extending through the composite passivation layer and directly disposed on at least one of the metal features, and a conductive pillar disposed on the UBM layer.

8. The semiconductor device of 7, wherein the UBM layer comprises multiple layers of conductive materials.

9. The semiconductor device of claim 1, wherein the thickness T1 is about 3 µm to 6 µm.

10. The semiconductor device of claim 1, wherein the HDP CVD oxide layer has a thickness T3, the nitride layer has a thickness T4, and the thickness T3 is substantially larger than the thickness T4.

11. A method, comprising:
    providing a plurality of metallization layers comprising a topmost metallization layer, the topmost metallization layer having two metal features separated by a gap, each metal feature having a thickness T1;
    depositing an oxide layer by performing high density plasma (HDP) chemical vapor deposition that covers the metal features and partially fills the gap; and
    depositing a nitride layer over the oxide layer thereby forming a composite passivation layer comprising the oxide layer and the nitride layer, wherein the composite passivation layer partially fills the gap and has a thickness T2 about 20% to 50% of the thickness T1;
    wherein the oxide layer forms an inclined roof structure over each of the metal features.

12. The method of claim 11, wherein the oxide layer deposits directly on the metal features and the gap.

13. The method of claim 11, wherein the nitride layer deposits conformally over the oxide layer.

14. The method of claim 11, further comprising depositing a plasma-enhanced oxide layer (PEOX) after the deposition of the oxide layer and before the deposition of the nitride layer.

15. The method of claim 11, wherein the metal features comprise aluminum.

16. The method of claim 11, wherein an aspect ratio of the gap is about 1.5 to 2.

17. The method of claim 11, further comprising forming an under bump metallurgy (UBM) layer extending through the composite passivation layer and directly contacting one of the two metal features, and forming a conductive pillar on the UBM layer.

18. The method of claim 17, wherein forming the UBM layer comprises forming multiple layers of conductive materials using a plating process.

19. The method of claim 11, wherein the thickness T1 is about 3 µm to 6 µm.

20. The method of claim 11, wherein the oxide layer has a thickness T3, the nitride layer has a thickness T4, and the thickness T3 is substantially larger than the thickness T4.

* * * * *